United States Patent [19]

Ishaq et al.

[11] Patent Number: 4,490,193
[45] Date of Patent: Dec. 25, 1984

[54] METHOD FOR MAKING DIFFUSIONS INTO A SUBSTRATE AND ELECTRICAL CONNECTIONS THERETO USING RARE EARTH BORIDE MATERIALS

[75] Inventors: Mousa H. Ishaq, Essex Junction; Stanley Roberts, South Burlington; James G. Ryan, Essex Junction, all of Vt.

[73] Assignee: International Business Machines Corporation, Armonk, N.Y.

[21] Appl. No.: 537,128

[22] Filed: Sep. 29, 1983

[51] Int. Cl.³ .................... H01L 21/225; H01L 21/28
[52] U.S. Cl. .................................. 148/188; 148/187; 29/591
[58] Field of Search ................ 148/187, 188; 29/589, 29/590, 591

[56] References Cited

U.S. PATENT DOCUMENTS

| 3,340,108 | 9/1967 | Vickery | 148/33 |
| 3,601,888 | 8/1971 | Engeler et al. | 29/578 |
| 3,887,993 | 6/1975 | Okada et al. | 29/571 |
| 4,180,596 | 12/1979 | Crowder et al. | 427/42 |
| 4,227,944 | 10/1980 | Brown et al. | 148/6 |
| 4,285,761 | 8/1981 | Fatula et al. | 156/628 |
| 4,329,706 | 5/1982 | Crowder et al. | 357/71 |
| 4,364,166 | 12/1982 | Crowder et al. | 29/571 |
| 4,378,628 | 4/1983 | Levinstein et al. | 29/571 |
| 4,389,255 | 6/1983 | Chen et al. | 148/1.5 |

FOREIGN PATENT DOCUMENTS 033336 10/1981 Japan.

OTHER PUBLICATIONS

V. L. Rideout, "Reducing the Sheet Resistance of Polysilicon Lines in Integrated Circuits", published in IBM TDB, vol. 17, No. 6, Nov. 1974, pp. 1831-1833.

Primary Examiner—Brian E. Hearn
Assistant Examiner—Alan E. Schiavelli
Attorney, Agent, or Firm—George Tacticos

[57] ABSTRACT

A method for diffusing a conductively determining impurity in a semiconductor substrate and making electrical contact thereto by depositing a layer of a rare earth boride material over a predetermined surface portion of the substrate and heating the substrate for a predetermined period of time at a predetermined temperature which is sufficient to cause boron from the boride material to diffuse into the adjoining portion of the substrate to modify its conductive characteristics. At the same time a good electrical ohmic contact is established between the boride material and the adjoining substrate portion while the boride material retains its conductivity even after the outdiffusion of some of its boron into the substrate during the heat treatment.

17 Claims, 4 Drawing Figures

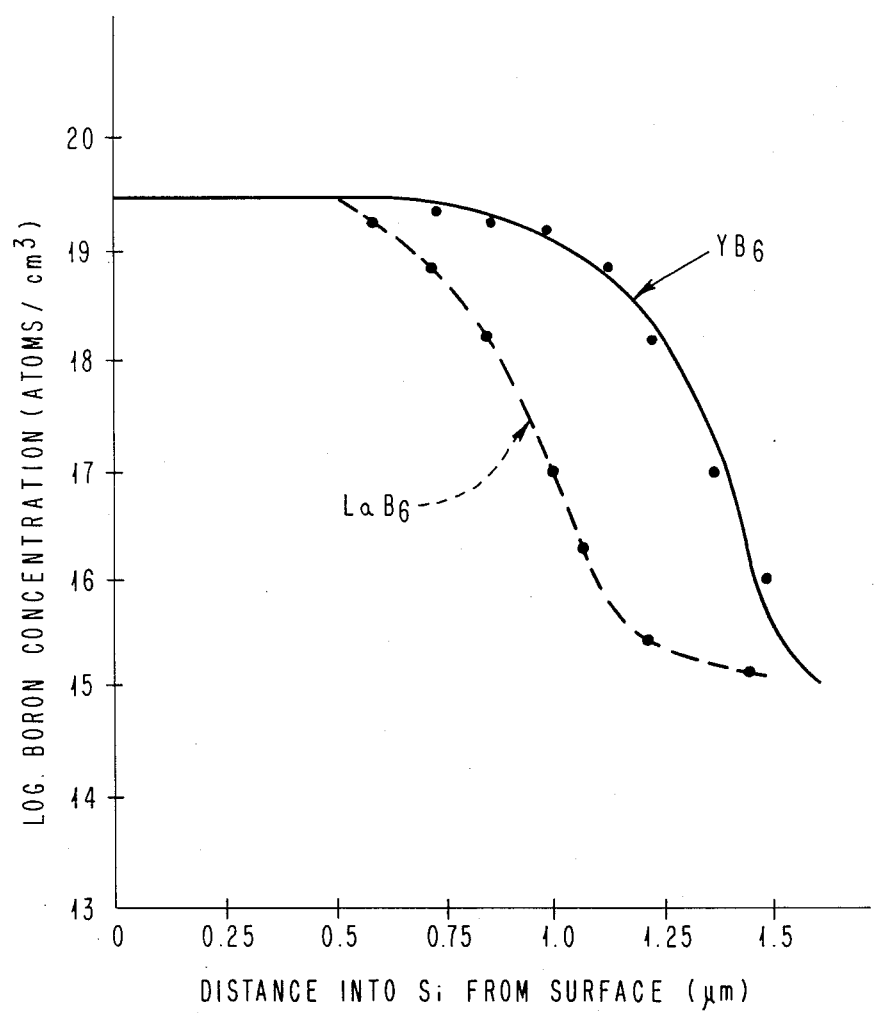

METHOD FOR MAKING DIFFUSIONS INTO A SUBSTRATE AND ELECTRICAL CONNECTIONS THERETO USING RARE EARTH BORIDE MATERIALS

RELATED APPLICATIONS

In a co-pending U.S. patent application Ser. No. 537,124, filed on Sept. 29, 1983, entitled "Method for Making Diffusions into a Substrate and Electrical Connections Thereto Using Silicon containing Rare Earth Hexaboride Materials" by Bouldin et al and assigned to the same assignee as the present Application, there is disclosed and claimed a method for making diffusions into a substrate and electrical connections thereto using a rare earth hexaboride material which contains a predetermined amount of silicon in it.

DESCRIPTION

1. Field of the Invention

The present invention relates in general to methods for making semiconductor structures and in particular to methods for diffusing conductivity determining impurities into predetermined regions of a substrate and making electrical connections thereto.

2. Background

In the prior art, metals (such as aluminum) and polycrystalline silicon (hereinafter referred to as "polysilicon") have been used as materials for interconnecting conductors in semiconductor devices. Polysilicon is often preferrable in many such applications because of its stability at high temperatures and because silicon dioxide can be deposited (through chemical vapor deposition processes) or thermally grown thereon. One of the undesirable features of polysilicon is its relatively high electrical resistance. In order to overcome this problem, polysilicon has been replaced for many of these applications with silicides of certain metals, such as molybdenum, tantalum, tungsten, rhodium and mixtures thereof. An article by V. L. Rideout entitled "Reducing the Sheet Resistance of Polysilicon Lines in Integrated Circuits" and published in IBM Technical Disclosure Bulletin, Volume 17, No. 6, November 1974, teaches the use of hafnium silicide as a conductive material in the place of polysilicon for the purpose of decreasing the resistance of these conductors. U.S. Pat. No. 4,180,596 issued on Dec. 25, 1979 to Billy L. Crowder and Stanley Zirinsky, entitled "Method for Providing a Metal Silicide Layer on a Substrate" and assigned to the present assignee, describes a method for providing a metal silicide on a semiconductor substrate, using a refractory metal, such as molybdenum, tantalum, tungsten, rhodium and mixtures thereof.

In the prior art some conductive lines made of metals or polysilicon have been used as sources for doping materials for the formation of doped regions in semiconductor devices. For example, U.S. Pat. No. 3,601,888 entitled "Semiconductor Fabrication Technique and Devices Formed Thereby Utilizing a Doped Metal Conductor" and issued Aug. 31, 1971 to W. E. Engeler et. al. teaches the use of a metal conductor made of a material such as molybdenum, doped with a conductivity determining impurity, such as boron, for use as a diffusion source and then as an electrode for the diffusion region. U.S. Pat. No. 3,887,993, entitled "Method of Making an Ohmic Contact With a Semiconductor Substrate" and issued on June 10, 1975 to T. Okada et. al. also discloses the use of a metal, such as tungsten, platinum or molybdenum which is doped with a conductivity determining impurity such as arsenic, boron, phosphorous or antimony to form diffusion regions in semiconductor substrates. Using a heat treatment the doping material is diffused in the semiconductor regions while the metal reacts with the semiconductor regions to form low resistivity ohmic contacts. This patent further suggests the use of two doping materials of opposite conductivity type on different portions of a metal line to form N-type and P-type diffusions on different regions of the substrate during the same diffusion steps.

U.S. Pat. No. 4,364,166 entitled "Semiconductor Integrated Circuit Interconnections", issued on Dec. 21, 1982 to Crowder et al. and assigned to the present assignee, discloses inter alia, the use of a composite structure of polysilicon and a metal silicide (hereinafter referred to as "polycide") on a substrate, with the polysilicon of the polycide doped with a material that outdiffuses into predetermined regions of the substrate during a heating cycle to make them conductive.

DISCLOSURE OF THE INVENTION

It is an object of this invention to provide a new and improved method for making doped regions in a semiconductor substrate from dopant materials that outdiffuse from an adjacent interconnecting conductive line and for forming ohmic contacts between the conductive line and these doped regions.

It is another object of this invention to provide a method for forming a conductive line on a semiconductor structure that is stable during high temperature processing and contains in it a conductivity determining material, a portion of which can outdiffuse and change the conductive characteristics of predetermined portions of the substrate without diminishing the conductivity of the conductive line.

It is still another object of this invention to provide a material and a method for using it to form an interconnecting conductive line from which dopants can be made to outdiffuse into predetermined regions of an adjoining substrate to form ohmic contacts between these regions and the conductive line, wherein the material of the conductive line has a low work function, a low barrier height, and a high corrosion resistance to chemicals used during the subsequent processing steps.

It is yet another object of this invention to provide a method for forming a conductor on a semiconductor substrate that can serve as a self-aligned diffusion source for doped regions in predetermined regions of the substrate and which is also compatible with the formation of a silicon layer over the conductor and the oxidation of this layer.

In accordance with the teachings of this invention, a method is provided for diffusing a conductivity determining impurity into a semiconductor substrate which includes depositing a conductive layer of a rare earth boride material over a surface portion of the substrate. The substrate is then heated for a predetermined period of time at a predetermined temperature which is sufficient to cause boron from the boride material to diffuse into the adjacent portion of the substrate so as to modify the conduction characteristics of this portion and to form an electrical ohmic contact between the conductive layer and the substrate portion. Since boron is a P-type dopant material, its effects on the semiconductor portion into which it diffuses is to make the material into a region of a P-type conductivity, or if the material is already P-type to give it an even higher P-type conductivity.

In one embodiment of this invention the substrate is covered with an electrically insulating material which is patterned to have openings exposing the portions of the substrate which are to be doped into P-type regions of a specified conductivity level. A rare earth hexaboride layer such as, for example, an yttrium hexaboride layer ($YB_6$) or a lanthanum hexaboride ($LaB_6$) layer is deposited over the insulating layer and through openings in this layer onto the exposed surface portions of the substrate.

One advantage of the present invention is that it provides refractory interconnections which have good electrical conductivity and can easily be formed using conventional dual electron-beam evaporation techniques, or sputtering from either a compound source or co-sputtering from metal and boron targets.

Another advantage of the present invention is that it provides a conductive line having low work function, low barrier height and high corrosion resistance to process chemicals (such as alkaline or acidic cleaning solutions). A further advantage of this invention is in that it provides for the doping of semiconductor regions with boron which outdiffuses from an adjacent conductive line without substantially affecting the conduction characteristics of the line. Furthermore, since boron is a part of the boride material used to make the conductive line, it does not have to be introduced into the line material through additional doping processes.

The above noted advantages make the invention useful for many applications such as for example the manufacture of conductive lines for interconnecting doped regions of CMOS structures. The low work function of rare earth boride materials combined with their high conductivity and their ability to outdiffuse boron for the formation of P-type diffusions without any significant reduction in conductivity make them superior to many other materials heretofore used for making conductive lines for CMOS structures.

The foregoing and other objects, features and advantages of the invention will become more readily apparent from the following and more particular description of the invention taken in conjunction with the accompanying drawings.

BRIEF DESCRIPTION OF THE DRAWINGS

FIG. 2 is a graphical representation of the boron concentration in a substrate portion as a function of its distance from the surface of the substrate following its outdiffusion from an adjacent rare earth boride conductive line in accordance with the teachings of the present invention.

DETAILED DESCRIPTION OF THE DRAWINGS

Figure 1A:
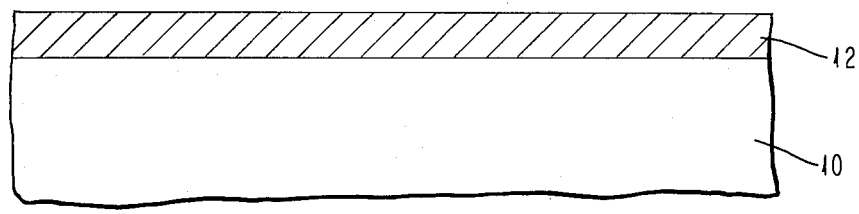
FIGS. 1a and 1c illustrate in a series of diagrammatic cross-sectional views a sequence of some of the most important process steps utilized in fabricating structures in accordance with the teachings of the present invention.
Figure 1B:
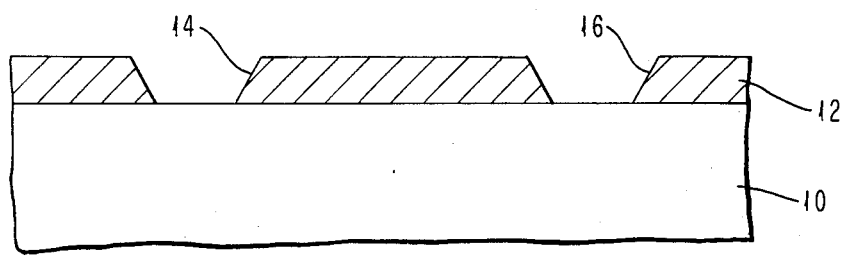
Figure 1C:
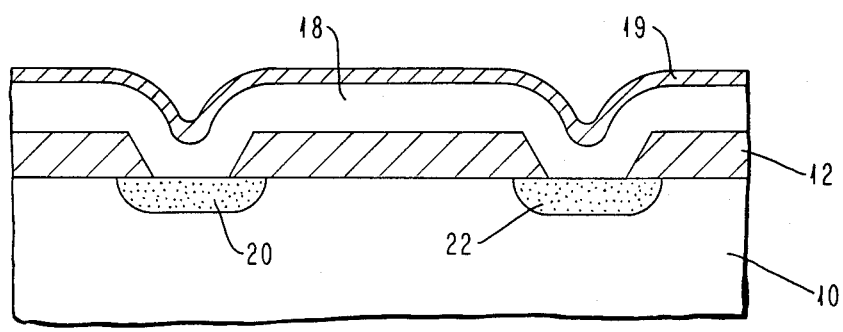

Referring now to FIG. 1a, there is shown a semiconductor substrate 10, such as a silicon wafer having a P-type conductivity, on which there is an electrically insulating layer 12, which can be silicon dioxide. The insulating layer 12, which may have a thickness of 200 to 500 nm, is patterned by conventional masking and etching techniques to form openings 14 and 16, as shown in FIG. 1b, exposing predetermined portions of the underlying surface of the semiconductor substrate 10. Using electron-beam evaporation techniques, or sputtering from either a compound source, or co-sputtering from a metal and a boron target of a rare earth boride material, such as lanthanum hexaboride, a layer is deposited and patterned to form a conductive line 18 disposed over the patterned insulating layer 12 and into openings 14 and 16 of the insulating layer 12, making contact with the exposed surface portions of the underlying semiconductor substrate 10 as shown in FIG. 1c. A capping layer 19 is made from a material that can provide oxidation protection to the underlying conductive line 18. Layer 19 may be a layer of silicon which during the subsequent heat treatment steps is converted partially or totally into a silicon dioxide layer. Alternatively, layer 19 may be a silicon dioxide layer or silicon covered by silicon dioxide (such as phospho-silicate glass). The structure is then heated for a predetermined period of time at a predetermined temperature level so that boron will outdiffuse from the boride line 18 into portions of the adjacent semiconductor substrate 10 which are in direct contact with the boride line 18. The temperature level and the heating time depends on the material used to make the conductive line 18, on the desired boron concentration in the substrate and on the desired depth of the diffusion regions 20 and 22. For example, if boron is diffused into silicon at 1000° C., a P-type region approximately 1 $\mu$m deep is formed in 3 hours. It is desirable for the rare earth boride material selected to form the conductive line in accordance with the teachings of this invention, to have a thermal expansion coefficient that approximates that of the semiconductor substrate 10 and the insulating material(s) 12 used with it in the structure to minimize the thermal stresses applied during the heating and cooling of the structure. Furthermore, it should have a high conductivity and the characteristics of a high temperature refractory material so that it does not melt or alloy with the adjacent semiconductor and insulating materials. It must also resist corrosion and it must adhere to the underlying insulating and semiconductor materials.

Table 1 below provides approximate values for some of the characteristic properties of two preferred borides used in practicing this invention.

TABLE 1

| | $YB_6$ | $LaB_6$ |
|---|---|---|
| 1. Melting Point (°C.) | 2,600 | 2,600 |
| 2. Thermal Expansion Coefficient ($\times 10^{-6}$/ °C.) | 6.1 | 6.3 |
| 3. Electrical Resistivity ($\mu\Omega \cdot cm$) | | |
| (a.) For Bulk Material | 40 | 17.4 |
| (b.) For Film | 70 to 120 | 50 to 120 |
| 4. Work Function (ev) | 2.22 | 2.66 |

Although the borides which are often referred to herein are $YB_6$ and $LaB_6$, other boride materials such as for example $YB_4$ and $LaB_4$, may be used with silicon substrates. Other rare earth boride materials are also suitable for use in practicing this invention, depending upon the type of the structure needed, the remaining processing steps that the structure will be subjected to and the subsequent planned uses of the structure.

Referring now to FIG. 2, there is shown a graphical representation of the logarithmic concentration profile of boron in a substrate, as a function of its distance from the surface of the substrate, for boron diffusions formed in accordance with the teachings of the present invention using conductive lines made of two different boride materials ($YB_6$, and $LaB_6$). The graphs of FIG. 2 indicate the isothermal outdiffusion of boron from a refractory boride film into a silicon body, in an <100> crystallographic orientation, with the silicon body having a P-type conductivity and a resistivity value of approximately 12 ohm-cm. The structures were subjected to a heat treatment at 1,000° C., for 270 minutes, in a nitrogen ambient.

While the invention has been described in connection with a preferred sequence of process steps used for making a semiconductor structure, it will be understood that the invention is not limited to those particular process steps, their sequence, or the final structures depicted in the drawings. On the contrary, it is intended to cover all alternatives, modifications and equivalents, as may be included within the spirit and scope of the invention as defined by the appended claims.

What is claimed is:

1. A method for diffusing a conductivity determining impurity into a semiconductor substrate and making electrical contact thereto comprising:
    depositing a conductive layer of a rare earth boride material over a predetermined surface portion of said substrate;
    heating said substrate for a predetermined period of time at a predetermined temperature sufficient to cause boron from said boride material to diffuse into said portion of said substrate so as to modify its conduction characteristics and to establish an electrical ohmic contact between said substrate portion and said conductive layer.

2. A method as set forth in claim 1, wherein said rare earth boride material is deposited over said substrate portion in a predetermined pattern.

3. A method as set forth in claim 2 wherein said predetermined pattern is established by forming a layer of an electrically insulating material on a surface of said substrate and then etching away portions of said insulating material to expose portions of said substrate wherein said exposed portions comprise said predetermined pattern.

4. A method as set forth in claim 1 wherein said rare earth boride is a material selected from the group consisting of: $YB_4$, $YB_6$, $LaB_4$, and $LaB_6$.

5. A method as set forth in claim 1 wherein said rare earth boride material is a rare earth hexaboride material.

6. A method as set forth in claim 5 wherein said rare earth hexaboride is a hexaboride selected from the group consisting of $YB_6$ and $LaB_6$.

7. A method as set forth in claim 1 which further includes depositing a oxidation protection layer over said conductive layer.

8. A method for making semiconductor devices wherein a conductive layer makes electrical contact with a predetermined region formed in a semiconductor substrate, characterized in that said conductive layer is made of a rare earth boride material and in that boron from said conductive layer outdiffuses during a heating cycle into said predetermined region so as to modify the conduction characteristics of said region and to establish an ohmic contact between said conductive layer and said substrate region.

9. A method as set forth in claim 8 wherein said rare earth boride material is a rare earth hexaboride material.

10. A method as set forth in claim 8 wherein said rare earth boride is a rare earth hexaboride material selected from the group consisting of $LaB_6$ and $YB_6$.

11. A method as set forth in claim 8 which is further characterized by depositing a layer of silicon over said conductive layer prior to said heating cycle.

12. A method as set forth in claim 11 which is further characterized by oxidizing said silicon layer during said heating cycle to convert it at least in part into a layer of silicon dioxide.

13. A method for forming a conductive structure on a semiconductor substrate making electrical contact with surface-adjacent regions of said substrate, characterized in that said conductive structure comprises a layer of a rare earth hexaboride material disposed over and in direct contact with said surface-adjacent regions and in that boron from said rare earth hexaboride material outdiffuses during a heating cycle of predetermined time and temperature, from said conductive structure into said substrate regions to thereby modify the conductive characteristics of said substrate regions through the addition of boron and to establish ohmic electrical contacts between said conductive structure and said substrate regions.

14. A method for making a semiconductor device wherein a conductive layer is patterned to make electrical contact with predetermined regions of said device characterized in that said conductive layer is made of a rare earth boride material.

15. A method as set forth in claim 14 which is further characterized by forming an oxidation protection layer over said conductive layer.

16. A method as set forth in claim 15 wherein said oxidation protection layer is made of silicon.

17. A method as set forth in claim 15 wherein said oxidation protection layer comprises of a layer of silicon covered by a phospho-silicate glass.

* * * * *